US009087688B2

(12) United States Patent
Ahn

(10) Patent No.: US 9,087,688 B2
(45) Date of Patent: Jul. 21, 2015

(54) SEMICONDUCTOR DEVICE AND METHOD OF MANUFACTURING THE SAME

(71) Applicant: SK Hynix Inc., Icheon-si, Gyeonggi-do (KR)

(72) Inventor: Young Soo Ahn, Yongin-si (KR)

(73) Assignee: SK HYNIX INC., Icheon-Si, Gyeonggi-Do (KR)

( * ) Notice: Subject to any disclaimer, the term of this patent is extended or adjusted under 35 U.S.C. 154(b) by 0 days.

(21) Appl. No.: 14/450,718

(22) Filed: Aug. 4, 2014

(65) Prior Publication Data

US 2014/0349455 A1 Nov. 27, 2014

Related U.S. Application Data

(62) Division of application No. 13/709,799, filed on Dec. 10, 2012, now Pat. No. 8,829,599.

(30) Foreign Application Priority Data

Jun. 18, 2012 (KR) ........................ 10-2012-0064953

(51) Int. Cl.

| | |
|---|---|
| ***H01L 21/336*** | (2006.01) |
| ***H01L 27/02*** | (2006.01) |
| ***H01L 29/792*** | (2006.01) |
| ***H01L 29/66*** | (2006.01) |
| ***H01L 27/115*** | (2006.01) |
| ***H01L 29/788*** | (2006.01) |

(52) U.S. Cl.

CPC ........ *H01L 27/0207* (2013.01); *H01L 27/1157* (2013.01); *H01L 27/11524* (2013.01); *H01L 27/11556* (2013.01); *H01L 27/11582* (2013.01); *H01L 29/66825* (2013.01); *H01L 29/66833* (2013.01); *H01L 29/7889* (2013.01); *H01L 29/7926* (2013.01)

(58) Field of Classification Search

CPC .................. H01L 27/11551; H01L 27/11526; H01L 27/11565; H01L 27/11529; H01L 27/11573; H01L 27/11578; H01L 27/2481; H01L 27/249; H01L 29/66825; H01L 29/7827; H01L 29/78642; G11C 16/0483; G11C 16/0408; G11C 5/02; G11C 5/063

USPC ........... 365/51, 185.05; 257/E29.3, 319, 774; 438/261, 268, 478, 703

See application file for complete search history.

(56) References Cited

U.S. PATENT DOCUMENTS

2009/0268523 A1* 10/2009 Maejima ................. 365/185.11

FOREIGN PATENT DOCUMENTS

KR 1020130006272 A 1/2013

OTHER PUBLICATIONS

Moon-Sik Seo et al., "A Novel 3-D Vertical FG NAND Flash Memory Cell Arrays Using the Separated Sidewall Control Gate (S-SCG) for Highly Reliable MLC Operation," IEEE International, pp. 22-25, May 2011.

*Primary Examiner* — Chuong A Luu
*Assistant Examiner* — Cory Eskridge
(74) *Attorney, Agent, or Firm* — Lowe Hauptman & Ham, LLP

(57) ABSTRACT

In a semiconductor memory device, a plurality of control gates is stacked in a first region and a second region of a substrate. A plurality of interlayer insulating layers is stacked in a portion of the second region of the substrate. Each interlayer insulating layer is formed at the same level as a corresponding one of the control gates. A plurality of sub-control gates is stacked in the first and second regions region of the substrate and interposed between the control gates and the interlayer insulating layers. A common node penetrates the interlayer insulating layers and the sub-control gates.

9 Claims, 8 Drawing Sheets

19 18 17 CP I I' 16 15 14 13

12 CN 12 12 12 12 17 II II' 16 15 14 13 11

SEMICONDUCTOR DEVICE AND METHOD OF MANUFACTURING THE SAME

CROSS REFERENCE TO RELATED APPLICATION

The present application is a Divisional Application of U.S. Ser. No. 13/709,799, filed on Dec. 10, 2012. It claims the priority of Korean Patent Application No. 10-2012-0064953, filed on Jun. 18, 2012 in the KIPO (Korean Intellectual Property Office), which is incorporated herein by reference in its entirety.

BACKGROUND

This disclosure is related to a semiconductor device and a method of manufacturing the same.

A non-volatile memory device retains data even in the absence of power supply. Two-dimensional memory devices in which memory cells are fabricated in a single layer over a silicon substrate are reaching physical limits in increasing their degree of integration. Accordingly, three-dimensional (3D) non-volatile memory devices in which memory cells are stacked in a vertical direction over a silicon substrate have been proposed.

The 3D non-volatile memory device includes a lower selection transistor, memory cells, and an upper selection transistor sequentially stacked along a channel layer protruded from a substrate. However, the inventor(s) has noted that in the foregoing structure, memory cells adjacent in the vertical direction are interfered, degrading the characteristics of the memory device.

SUMMARY

In a semiconductor memory device according to at least one embodiment of the present invention, a plurality of control gates is stacked in a first region and a second region of a substrate. A plurality of interlayer insulating layers is stacked in a portion of the second region of the substrate. Each interlayer insulating layer is formed at the same level as a corresponding one of the control gates. A plurality of sub-control gates is stacked in the first and second regions of the substrate and interposed between the control gates and the interlayer insulating layers. A common node penetrates the interlayer insulating layers and the sub-control gates.

In a method of manufacturing a semiconductor memory device according to at least one embodiment of the present invention, first conductive layers and sacrificial layers are alternately formed on a substrate on which a first region and a second region are defined. Slits are formed through the first conductive layers and the sacrificial layers. The sacrificial layers exposed through the slits are etched such that the sacrificial layers of the second region remain partially. Second conductive layers are formed in first recess regions in which the sacrificial layers have been etched. A common node is formed penetrating the first conductive layers and the sacrificial layers remaining in the second region.

DESCRIPTION OF EMBODIMENTS

Figure 1A:
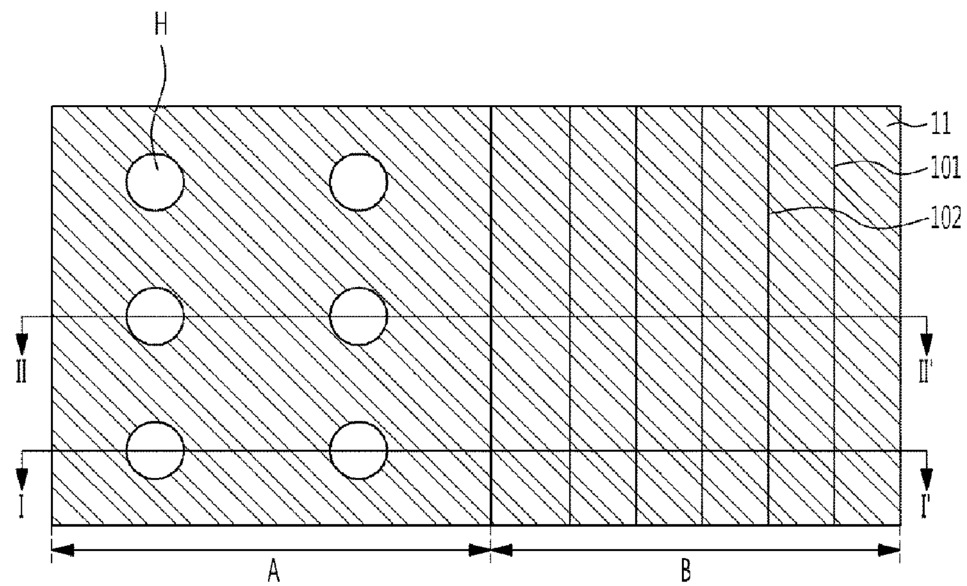
FIGS. 1A to 4C are views illustrating a method of manufacturing a semiconductor device according to at least one embodiment of the present invention.

Hereinafter, various embodiments of the present disclosure will be described in detail with reference to the accompanying drawings. The figures are provided to enable those of ordinary skill in the art to make and use the embodiments of the present invention.

FIGS. 1A to 4C are views illustrating a method of manufacturing a semiconductor device according to at least one embodiment of the present invention. FIGS. 1A to 4A are layout (plan) views, and FIGS. 1B to 4B are cross-sectional views taken along lines I-I' of FIGS. 1A to 4A, respectively. FIGS. 1C to 4C are cross-sectional views taken along lines II-II' of FIGS. 1A to 4A, respectively. In the drawings, selection transistors are not illustrated and regions in which memory cells are formed are schematically illustrated for the description purpose. In addition, in the layout views in FIGS. 1A to 4A, main layers are depicted, and some of the layers are not depicted.

Figure 1B:
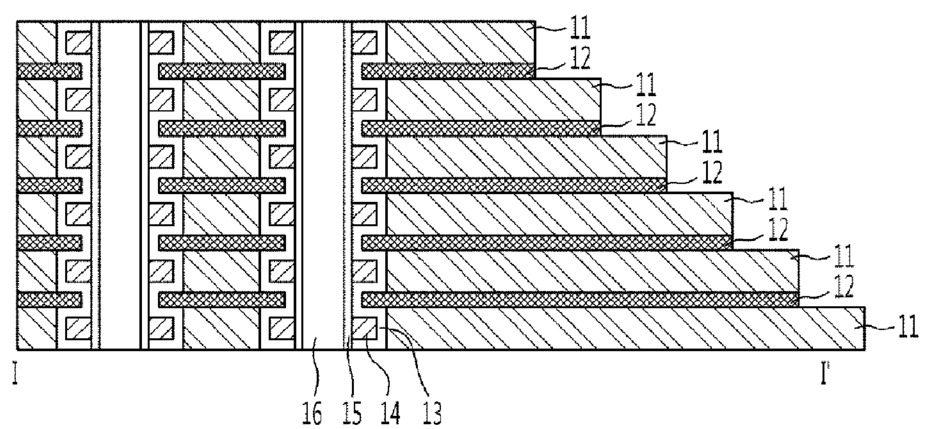
Figure 1C:
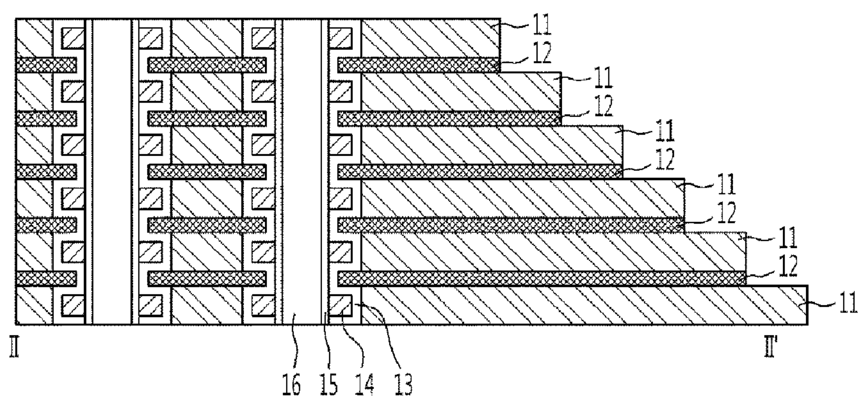

As illustrated in FIGS. 1A to 1C, first conductive layers 12 and sacrificial layers 11 are alternately formed on a substrate (not shown) including a first region and a second region. Although not shown, a given lower structure including a source region, a lower selection transistor, and a pipe transistor, may be formed on the substrate. In this case, the first conductive layers 12 and the sacrificial layers 11 are formed on the lower structure with an interlayer insulating layer interposed therebetween.

Here, the substrate includes the first region and the second region. The first region is a region in which memory cells are to be formed, and the second region B is a region in which memory cells are not to be formed. In some embodiments, the second region is patterned stepwise in order to connect contact plugs to the stacked conductive layers. For illustration purposes, the first region is referred to as a memory cell region A, and the second region is referred to as a contact region B.contact region The contact region B may be formed at one side of the memory cell region A or may be formed at more than one sides of the memory cell region A. For example, the memory cell region A may be located between contact regions B.

The first conductive layers 12 and the sacrificial layers 11 are formed on both of the memory cell region A and the contact region B.

The first conductive layers 12, serving to form sub-control gates, may be formed of a conductive layer, such as an impurity-doped polysilicon layer. The sacrificial layers 11, also referred to as interlayer insulating layers and serving to form control gates, may comprise an oxide layer or a nitride layer. The first conductive layers 12 and the sacrificial layers 11 may be formed to have the same thickness or different thicknesses. For example, the sacrificial layers 11 may be formed to be thicker than the first conductive layers 12 in consideration of a thickness of a second charge blocking layer to be formed after the sacrificial layers 11 are removed in subsequent processes.

Subsequently, as best seen in FIG. 1A, the first conductive layers 12 and the sacrificial layers 11 are etched to form channel holes H positioned in the memory cell region A. Subsequently, portions of the sacrificial layers 11 exposed on inner walls of the channel holes H are etched to form first recess regions. Subsequently, first charge blocking layers 13 are formed along inner surfaces of the first recess regions. In one or more embodiments, the first charge blocking layers 13 are made of one or more materials including, but not limited to, oxide layers and high-k dielectric materials.

Subsequently, charge storage layers 14 are formed within portions of the first recess regions that have not been filled by the first charge blocking layers 13. Subsequently, tunnel insulating layers 15 are formed on inner wall surfaces of the channel holes H. Here, the charge storage layers 14 may include at least one of a polysilicon layer, a nitride layer, and a nano-dot containing layer. For example, the charge storage layer 14 may be a floating gate formed of a polysilicon layer. In one or more embodiments, the tunnel insulating layers 15 are made of one or more materials including, but not limited to, oxide layers.

Subsequently, channel layers 16 are formed on the tunnel insulating layers 15. Here, the channel layers 16 may be formed to fully fill the channel holes H or may be formed to have an open central region. The open central region of the channel layers 16 is filled with an insulating layer, such as an_oxide layer. In one or more embodiments, the channel layers 16 are made of one or more materials including, but not limited to, polysilicon layers. Accordingly, memory cells stacked in the memory cell region A are formed.

Subsequently, a slimming process is performed to pattern the first conductive layers 12 and the sacrificial layers 11 formed in the contact region B in a stepwise pattern. For example, a photoresist pattern is formed on the first conductive layers 12 and the sacrificial layers 11 to cover the memory cell region A and the contact region B up to, e.g., a line 101 in FIG. 1A. Subsequently, a topmost pair of the first conductive layer 12 and the sacrificial layer 11 exposed by the photoresist pattern is etched by a first etch process, which stops at the second-from-top sacrificial layer 11 best seen in FIG. 1B, to form a step. Subsequently, the photoresist pattern is reduced to a line 102 in FIG. 1A, and a second-from-top pair of the first conductive layer 12 and the sacrificial layer 11 exposed by the reduced photoresist pattern is etched by a second etch process which stops at the third-from-top sacrificial layer 11 best seen in FIG. 1B. Here, the topmost pair of the first conductive layer 12 and the sacrificial layer 11 that has been etched by the first etch process is also etched in the second etch process so that the step thereof may be lowered in level. In this manner, the process of reducing the photoresist pattern and the second etch process are repeated so that the first conductive layers 12 and the sacrificial layers 11 in the contact region B are stepwise patterned.

Here, the slimming process is performed such that each pair of the first conductive layer 12 and the sacrificial layer 11 forms a single tier. Also, each tier is comprised of the upper sacrificial layer 11 and the lower first conductive layer 12, and the sacrificial layer 11 is exposed from an upper surface of each tier. Thus, since the sacrificial layer 11 is exposed from the upper surface of each tier, a control gate and a contact plug formed in subsequent processes may be easily coupled.

In at least one embodiment, the slimming process is performed after the memory cells are formed. In at least one embodiment, the memory cells are formed after the slimming process. In at least one embodiment, one or more steps of the slimming process is/are performed while the memory cells are being formed, or vice versa.

Figure 2A:
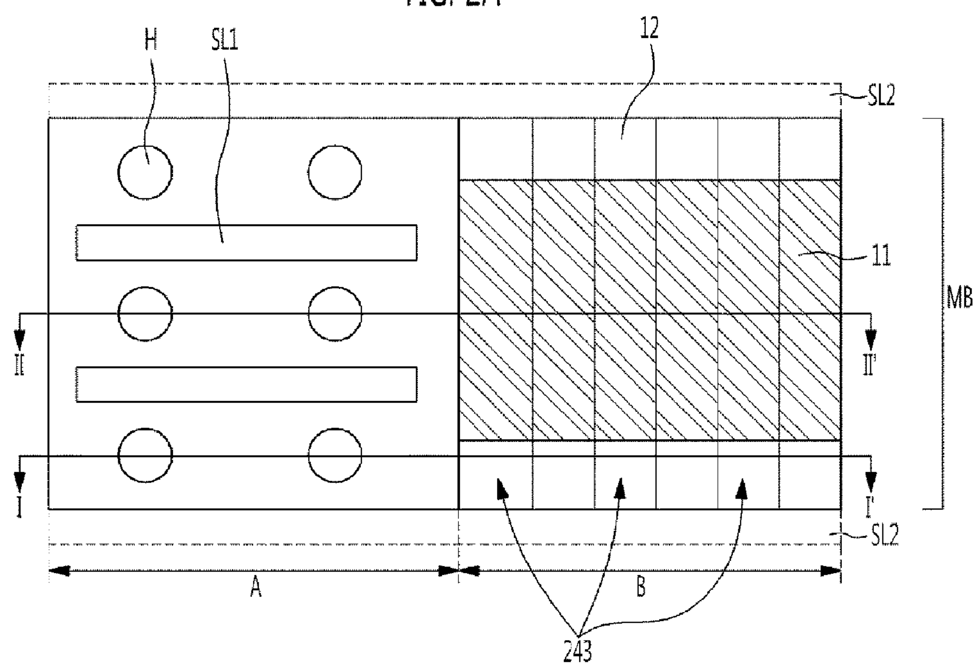
Figure 2B:
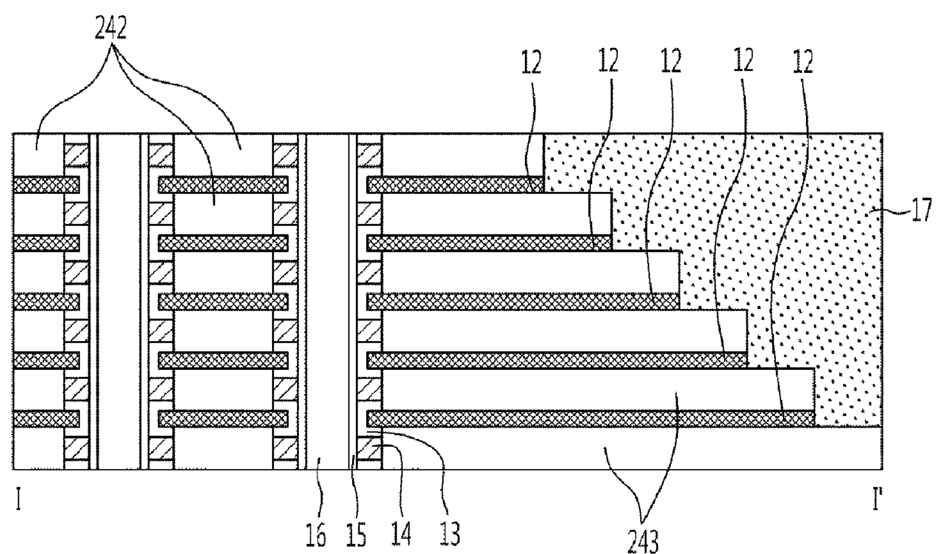
Figure 2C:
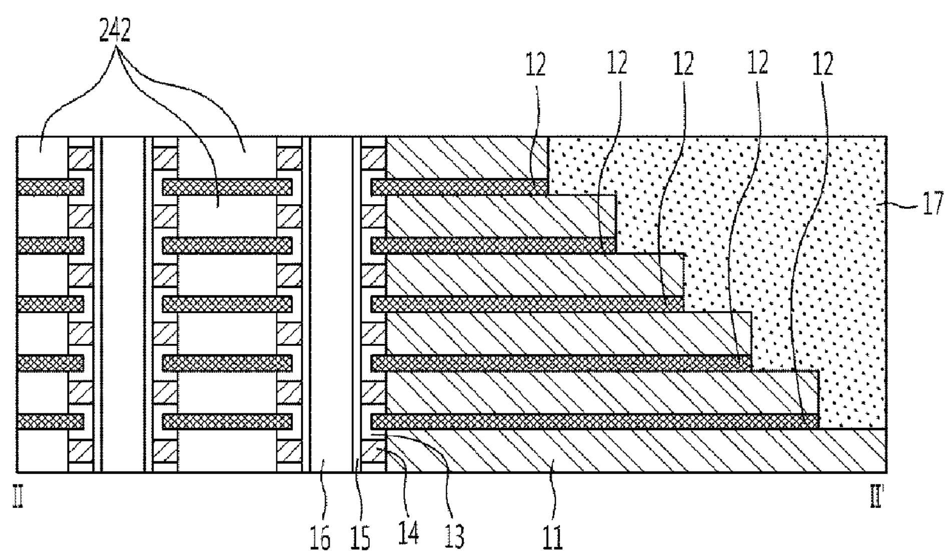

As illustrated in FIGS. 2A to 2C, an interlayer insulating layer 17 is formed on the entirety of the resultant structure on which the slimming process was performed and the memory cells were formed. For the sake of simplicity, the interlayer insulating layer 17 is not illustrated in FIGS. 2A, 3A and 4A. The interlayer insulating layer 17 is made of one or more materials including, but not limited to, an oxide layer. Subsequently, the interlayer insulating layer 17, the first conductive layers 12 and the sacrificial layers 11 are etched to form slits SL1 and SL2.

The slits SL1 and SL2 include first slits SL1 formed between the channel holes H within each memory block MB, and second slits SL2 formed at the boundaries between the adjacent memory blocks MB. Each of the slits SL1 and SL2 has a depth deep enough to expose all the sacrificial layers 11. Also, all the slits SL1 and SL2 may be simultaneously formed, or some of the slits SL1 and SL2 may be primarily formed. For example, insulating layers may fill the first formed slits SL1 and/or SL2, and subsequently, the other remaining slits SL1 and/or SL2 may be secondarily formed.

In FIG. 2A, it is illustrated that the first slits SL1 are formed in the memory cell region A. However, the first slits SL1 may extend to the contact region B or at least one slit different from the first slits SL1 and second slits SL2 may be formed in the contact region B. In addition, each of the slits SL1 and SL2 may be formed in various shapes, such as a line, a hole, or the like.

Subsequently, the sacrificial layers 11 exposed through the slits SL1 and SL2 are etched. Here, an etching thickness of the sacrificial layers 11 is adjusted such that the sacrificial layers 11 of the contact region B may remain. Here, the sacrificial layers 11 of the memory cell region A removed from portions where memory cells are to be formed. For example, the sacrificial layers 11 of the memory cell region A are entirely removed while some portions of the sacrificial layers 11 of the contact region B remain. For example, the etching thickness of the sacrificial layers 11 may be adjusted by adjusting an etching condition such as time, or the like. It should be noted that the shapes of the remaining sacrificial layers 11 in the contact region B are for illustrative purposes only. In various embodiments, depending on different etching conditions, the remaining sacrificial layers 11 in the contact region B have different shapes. The etching is performed to remove the sacrificial layers 11 from at least one side of the contact region B adjacent one of the slit SL2, as indicated at 243 in FIGS. 2A, 2B.

Here, a second recess region 242, from which the sacrificial layers 11 of the memory cell region A were removed, is a region in which a control gate is to be formed. Also, a third recess region 243, from which the sacrificial layers 11 of the contact region B were removed, is a region in which a contact pad is to be formed.

In the case of the sacrificial layers 11 formed in the contact region B, since the sacrificial layers 11 are stepwise patterned through the slimming process, the sacrificial layers 11 positioned at a lower side have a larger width (from the boundary between the regions A and B) than the sacrificial layers 11 positioned at an upper side. Thus, the sacrificial layers 11 positioned at the lower side also remain with a larger width.

In the process of etching the sacrificial layers 11, the first charge blocking layer 13 exposed in the second and third recess regions 242, 243 is also etched to expose the charge storage layer 14.

Figure 3A:
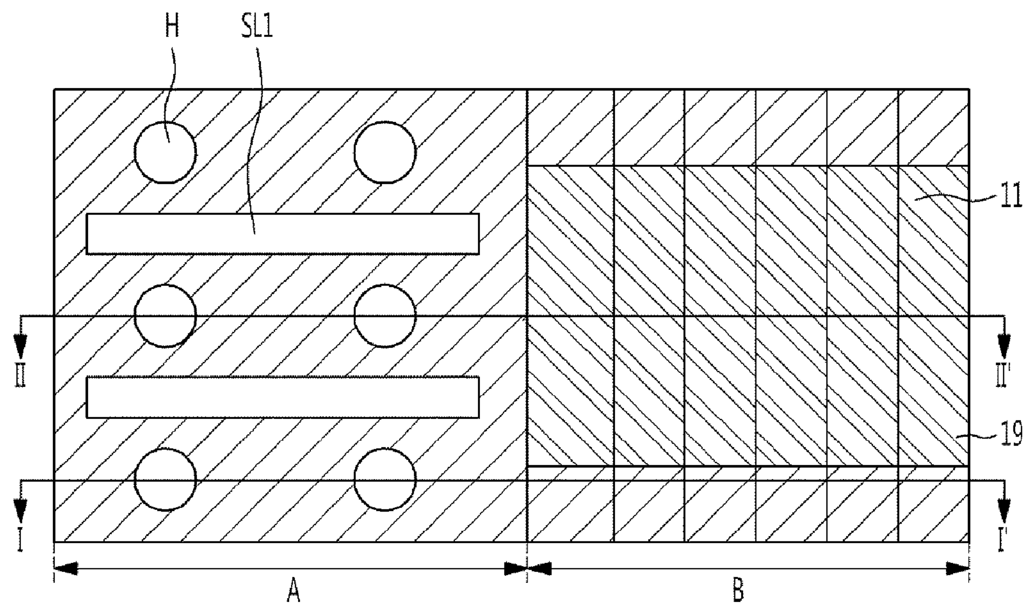
Figure 3B:
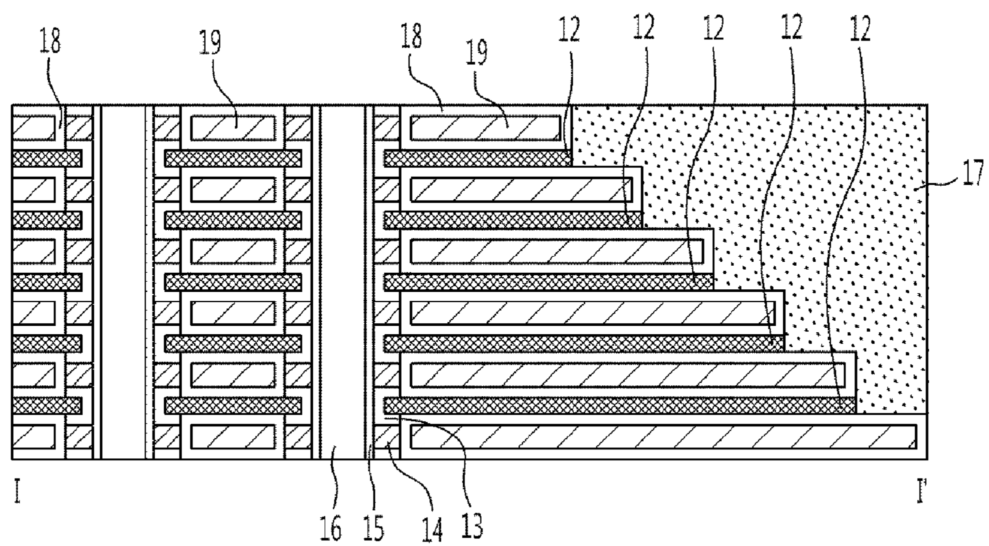
Figure 3C:
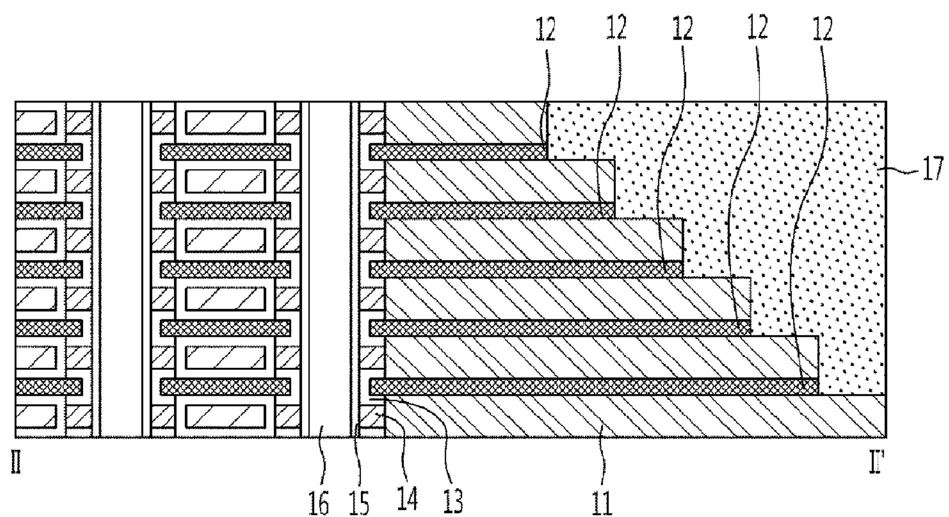

As illustrated in FIGS. 3A to 3C, second charge blocking layers 18 are formed along inner surfaces of the second and third recess regions, and subsequently, second conductive layers 19 are formed within portions of the second and third recess regions that have not been filled by the charge blocking layers 18. In some embodiments, the second charge blocking layers 18 are made of one or more materials including, but not limited to, oxide layers and high-k dielectric materials. Subsequently, insulating layers made of one or more materials including, but not limited to, oxide layers, are filled in the slits SL1 and SL2.

Here, the second charge blocking layers 18 are interposed between the first conductive layers 12 and the second conductive layers 19 to electrically separate the first conductive layers 12 and the second conductive layers 19. Also, the second charge blocking layers 18 are interposed between the charge storage layers 14 and the second conductive layers 19. Thus, although the first charge blocking layers 13 are damaged in the process of etching the sacrificial layers 11, since the second charge blocking layers 18 are present, the first charge blocking layers 13 may be complemented.

The second conductive layers 19 may be polysilicon layers or metal layers such as tungsten (W), or the like. The second conductive layers 19 may be used as control gates of the memory cells.

Figure 4A:
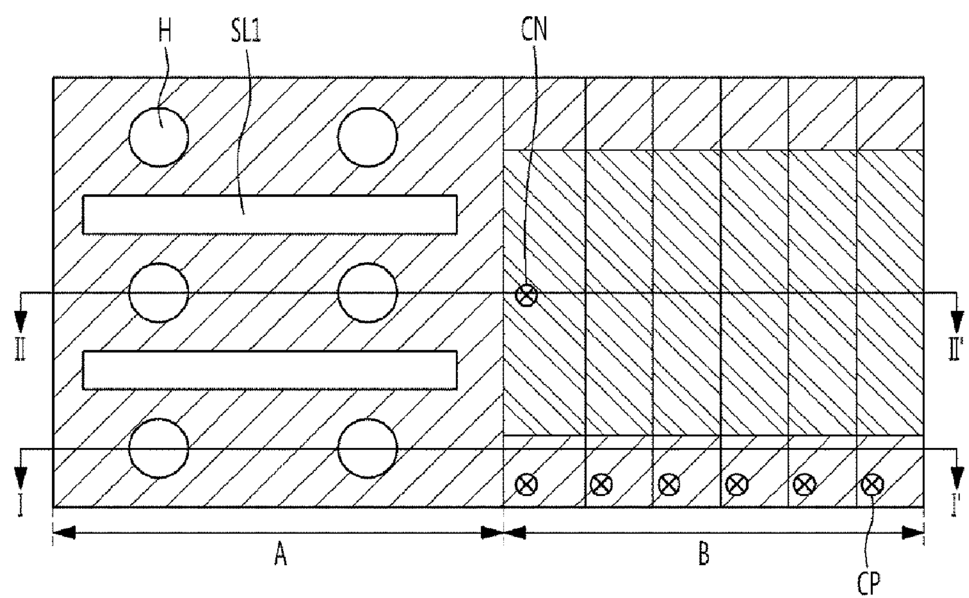
Figure 4B:
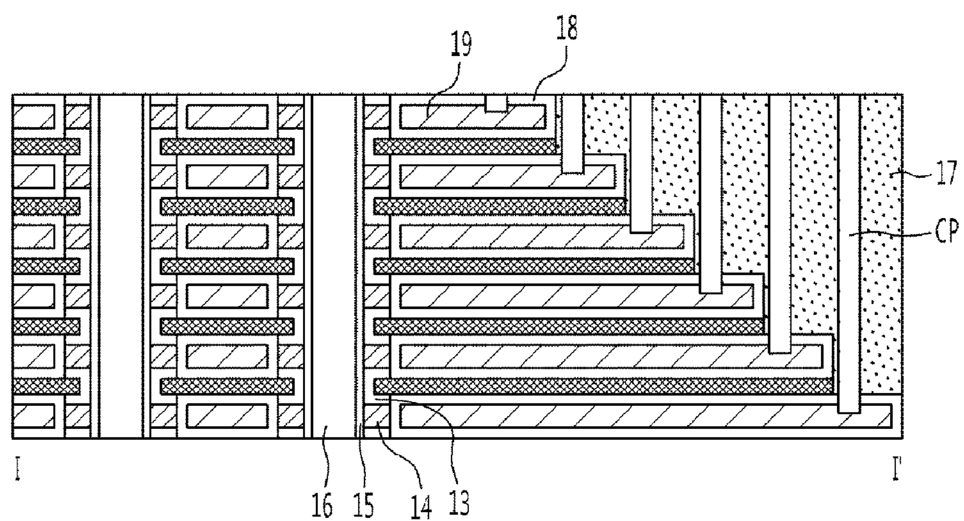
Figure 4C:
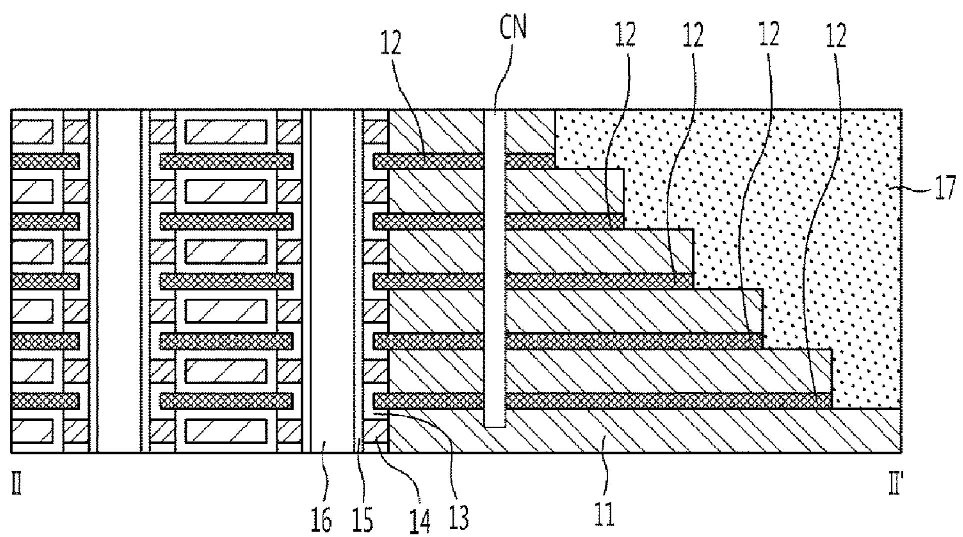

As illustrated in FIGS. 4A to 4C, the interlayer insulating layers 17 and the second charge blocking layers 18 are etched to form first contact holes exposing the second conductive layers 19, respectively. Subsequently, the first contact holes are filled with a conductive material to form contact plugs (CP) coupled to the second conductive layers 19 exposed at each tier in the contact region B. The conductive material includes, but is not limited to, one or more of_ polysilicon and tungsten.

Subsequently, the interlayer insulating layers 17, the first conductive layers 12, and the remaining sacrificial layers 11 are etched to form a second contact hole positioned in the contact region B. Subsequently, the second contact hole is filled with a conductive material to form a common node CN coupled to the first conductive layers 12. In one or more embodiments, the material and formation of the common node CN are similar to those of the contact plugs CP.

Here, the common node CN serves to apply a common voltage to the first conductive layers 12. Thus, in at least one embodiment of the present invention, the common node CN is formed in a region in which the first conductive layers 12 and the sacrificial layers 11 are alternately stacked such that the common node CN is coupled to all the first conductive layers 12 and is electrically separated from the second conductive layers 19. Namely, the common node CN is formed in a region in which the sacrificial layers 11 of the respective layers remain, whereby the common node CN may be naturally insulated from the second conductive layers 19. Thus, the common node CN may be easily formed without forming an additional insulating layer, or the like, for insulating the common node CN and the second conductive layers 19.

In some embodiments, the contact plugs (CP) are formed after or concurrently with the common node CN.

Figure 5:
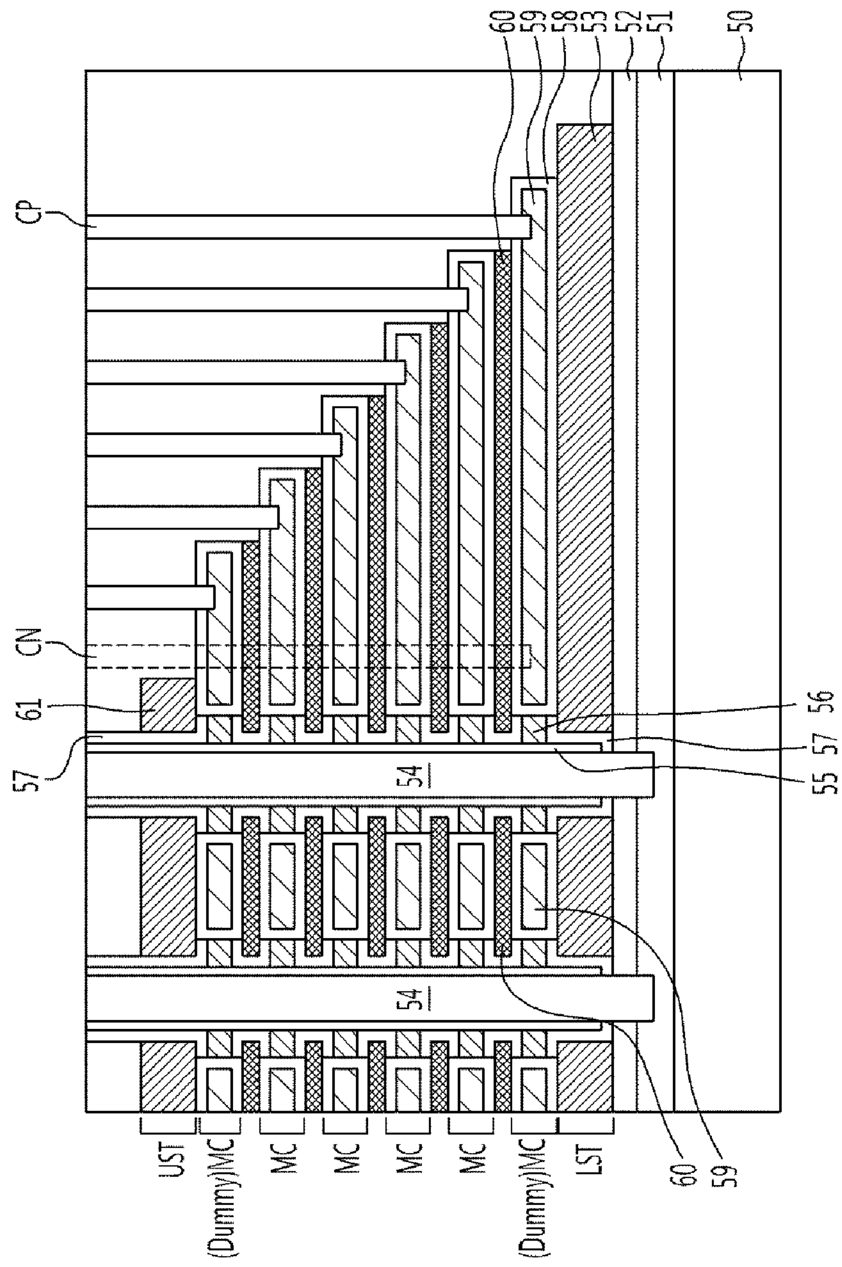
FIG. 5 is a cross-sectional view of a semiconductor device according to at least one embodiment of the present invention.

FIG. 5 is a cross-sectional view of a semiconductor device according to at least one embodiment of the present invention. In particular, a case in which memory strings are arranged to be perpendicular from the substrate will be described.

As illustrated in FIG. 5, a semiconductor device according to at least one embodiment of the present invention includes channel layers 54 protruded from a substrate 50 having a source region 51, at least one lower selection transistor (LST) a plurality of memory cells MC, and at least one upper selection transistor (UST), sequentially stacked along each of the channel layers 54. In some embodiments, the channel layers 54 and the memory cells MC are formed similarly to the channel layers 16 and the memory cells described herein. In some embodiments, the source region 51 may be formed by doping the substrate 10 with impurities or may comprise a conductive layer such as a polysilicon layer.

The lower selection transistor LST is formed on the substrate 50 with an interlayer insulating layer 52 interposed therebetween. The lower selection transistor LST includes a channel layer 54, a gate insulating layer surrounding the channel layer 54, and a lower selection gate 53 surrounding the channel layer 54 with the gate insulating layer interposed therebetween. For example, a tunnel insulating layer 55 and a first charge blocking layer 57 may be function as gate insulating layers. Also, the lower selection gate 53 may be formed of a polysilicon layer. In some embodiments, the tunnel insulating layer 55 and the first charge blocking layer 57 are formed similarly to the tunnel insulating layers 15 and the first charge blocking layers 13 described herein.

The memory cells MC are stacked on the lower selection transistor (LST) with the first and second charge blocking layers 57 and 58 interposed therebetween. Each of the respective memory cells MC includes the channel layer 54, the tunnel insulating layer 55 surrounding the channel layer 54, the charge storage layer 56 surrounding the channel layer 54 with the tunnel insulating layer 55 interposed therebetween, and the control gate 59 surrounding the charge storage layer 56 with at least the second charge blocking layer 58 interposed therebetween. In some embodiments, the charge storage layer 56, the second charge blocking layer 58 and the control gate 59 are formed similarly to the charge storage layers 16, the second charge blocking layer 18 and the second conductive layers 19 described herein.

Here, the memory cells MC adjacent to the lower selection transistor LST and the upper selection transistor UST may be dummy cells. When the memory strings are arranged vertically, the lowermost memory cell MC and the uppermost memory cell MC may be dummy cells.

The upper selection transistor UST is formed on the memory cells MC with the first charge blocking layers 57 interposed therebetween. The upper selection transistor UST includes the channel layer 54, a gate insulating layer surrounding the channel layer 54, and an upper selection gate electrode 61 surrounding the channel layer 54 with the gate insulating layer interposed therebetween. For example, the tunnel insulating layer 55 and the first charge blocking layer 57 may be function as gate insulating layers. Also, the upper selection gate 61 may be formed of a polysilicon layer.

In some embodiments, the lower selection transistor LST and the upper selection transistor UST are formed together with the memory cells MC, or, in further embodiments, formed through a separate process. For example, the interlayer insulating layer 52 and a conductive layer for a lower selection gate are formed on the substrate 50 having the source region 51, first conductive layers and sacrificial layers are alternately formed, and subsequently, a conductive layer for an upper selection gate is formed. Subsequently, the conductive layer for an upper selection gate, the first conductive layers, the sacrificial layers, the conductive layer for a lower selection gate, and the interlayer insulating layer 52 are etched to from channel holes. Subsequent processes are performed in substantially the same manner as described above. In another example, after the lower selection transistor LST is formed, the memory cells MC are formed, and subsequently, the upper selection transistor UST is formed.

The semiconductor device further includes sub-control gates 60 each of which is interposed between every two adjacent control gates 59 of the stacked memory cells MC. The sub-control gates 60 may be formed of conductive layers such as impurity-doped polysilicon layers. In some embodiments, the sub-control gates 60 are defined by the first conductive layers 12 as described herein.

Here, the sub-control gates 60 and the control gates 59 formed in the contact region B are stepwise patterned, and each pair of an upper control gate 59 and a lower sub-control gate 60 is patterned to form a single tier. Also, the control gates 59 of the respective tiers are coupled to the corresponding contact plugs (CP).

Also, the semiconductor device further includes the common node CN penetrating the alternately stacked sub-control gates 60 and the remaining sacrificial layers (not shown in FIG. 5). Here, the common node CN may be formed in every memory block. In FIG. 5, the common node CN is indicated by dotted lines.

According to such a structure, the respective memory cells MC have a gate-all-around structure in which the control gate 59 completely covers lateral surface of the charge storage layer 56. Thus, an electric field may be formed evenly on the entire surface of the charge storage layer 56, rather than being concentrated on a portion of the charged storage layer 56. Also, the sub-control gate 60 is interposed between every two adjacently stacked control gates 59, and the same voltage may be applied to the sub-control gates 60 through the common node CN during an operation of the semiconductor device. Thus, during an operation of the semiconductor device, the sub-control gates 60 serve as a shield between the memory cells MC, thus minimizing interference between the memory cells MC.

For example, during a program operation, a program voltage is applied to a selected control gate 59 and a pass voltage is applied to unselected control gates 59. Here, a voltage having a level higher than the pass voltage and lower than the program voltage is applied to the sub-control gates 60 through the common node CN, thereby minimizing interference between adjacent memory cells MC.

During a read operation, a read voltage is applied to a selected control gate 59, a turn-on voltage is applied to unselected control gates 59, and an operating voltage is applied to the sub-control gates 60. Here, the read voltage has a level that turns off a programmed memory cell MC and turns on an erased memory cell MC. Also, the turn-on voltage is a voltage having a level that turns on the memory cells MC irrespective of a programmed or erased state. In this manner, interference between adjacent memory cells MC may be minimized.

During an erase operation, the control gates 59 are grounded, an erase voltage is applied to a bulk of the substrate 50, and the sub-control gates 60 are grounded, whereby an erase speed may be increased.

In some embodiments, memory strings may be arranged in a U shape on the substrate. In such a case, the semiconductor device further includes a pipe channel layer connecting lower portions of the channel layers, a pipe gate surrounding the pipe channel layer, and a pipe gate insulating layer interposed between the pipe channel layer and the pipe gate. For example, the tunnel insulating layer and the first charge blocking layer may be function as a pipe gate insulating layer.

Figure 6:
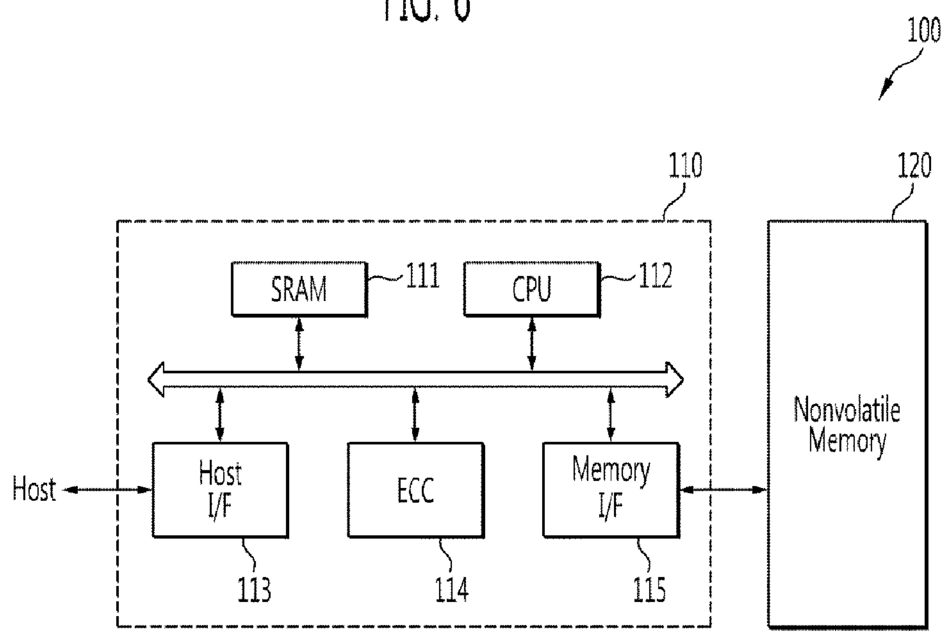
FIG. 6 is a block diagram showing the configuration of a memory system according to at least one embodiment of the present invention.

FIG. 6 is a view illustrating the configuration of a memory device according to at least one embodiment of the present invention.

As illustrated in FIG. 6, a memory system 100 according to at least one embodiment of the present invention includes a non-volatile memory device 120 and a memory controller 110.

The non-volatile memory device 120 is configured to include the memory cell structure as described above. In addition, the non-volatile memory device 120 may be a multi-chip package including a plurality of flash memory chips.

The memory controller 110 may be configured to control the non-volatile memory device 120. The memory controller 110 may include SRAM 111, a CPU 112, a host interface 113, an ECC 114 and a memory interface 115. The SRAM 111 may function as an operation memory of the CPU 112. The CPU 112 may perform the general control operation for data exchange of the memory controller 110. The host interface 113 may include a data exchange protocol of a host being coupled to the memory system 100. In addition, the ECC 114 may detect and correct errors included in a data read from the non-volatile memory device 120. The memory interface 115 may interface with the non-volatile memory device 120. The memory controller 110 may further include ROM that stores code data to interface with the host.

The memory system 100 having the above-described configuration may be a solid state disk (SSD) or a memory card in which the memory device 120 and the memory controller 110 are combined. For example, when the memory system 100 is an SSD, the memory controller 110 may communicate with the outside (e.g., a host) through one of the interface protocols including USB, MMC, PCI-E, SATA, PATA, SCSI, ESDI and IDE.

Figure 7:
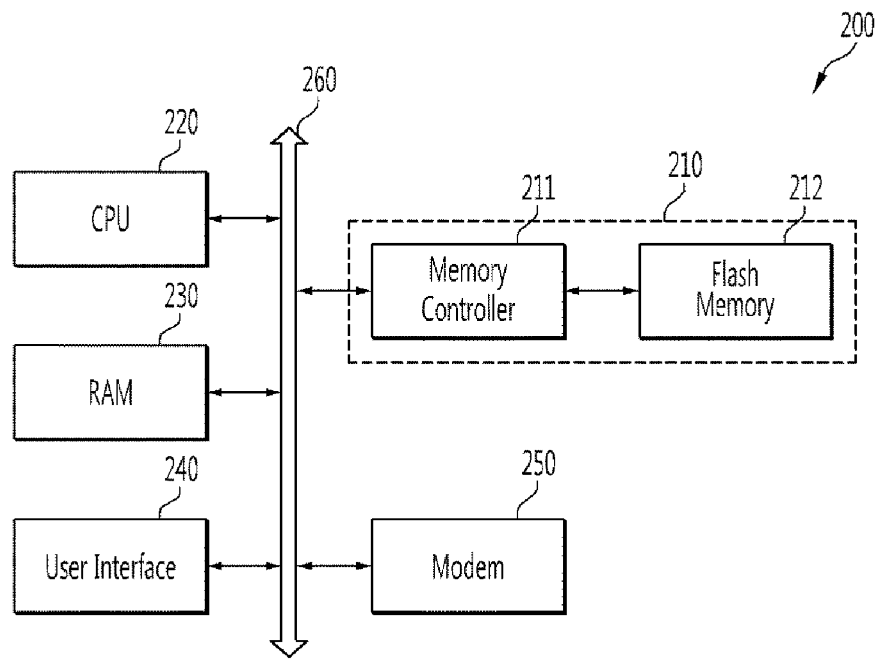
FIG. 7 is a block diagram showing the configuration of a computing system according to at least one embodiment of the present invention.

FIG. 7 is a view illustrating the configuration of a computing system according to at least one embodiment of the present invention.

As illustrated in FIG. 7, a computing system 200 according to at least one embodiment of the present invention may include a CPU 220, RAM 230, a user interface 240, a modem or network interface 250 (including, but not limited to, voice and/or data network interface) and a memory system 210 that are electrically coupled to a system bus 260. In addition, when the computing system 200 is a mobile device, a battery may be further included to apply operating voltage to the computing system 200. The computing system 200 may further include application chipsets, a Camera Image Processor (CIS), and mobile DRAM.

As described above with reference to FIG. 6, the memory system 210 may include a non-volatile memory 212 and a memory controller 211.

According to at least one embodiment of the present invention, the semiconductor device includes the common node penetrating the interlayer insulating layers and the sub-control gates, which are alternatingly stacked on each other in the contact region, and during an operation of the semiconductor device, the same voltage is applied to the sub-control gates through the common node. Thus, interference between adjacent memory cells may be minimized. In addition, when the semiconductor device is manufactured, the common node is formed through the alternatingly stacked interlayer insulating layers and sub-control gates. Thus, the common node may be easily formed without performing an additional process.

While several embodiments of the present invention have been shown and described, it will be apparent to those of ordinary skill in the art that modifications and variations can be made without departing from the spirit and scope of the invention as defined by the appended claims.

What is claimed is:

1. A method of manufacturing a semiconductor memory device, the method comprising:

alternately forming first conductive layers and sacrificial layers on a substrate on which a first region and a second region are defined;

forming slits through the first conductive layers and the sacrificial layers;

forming first recess regions by etching the sacrificial layers exposed through the slits, wherein the sacrificial layers of the second region remain partially;

forming second conductive layers in the first recess regions; and forming a common node penetrating the first conductive layers and the sacrificial layers remaining in the second region.

2. The method of claim 1, wherein the forming of the slits through the first conductive layers and the sacrificial layers comprises removing sacrificial layers of the first region from portions where memory cells are to be formed.

3. The method of claim 1, further comprising:

patterning the first conductive layers and the sacrificial layers of the second region in to a stepwise pattern.

4. The method of claim 3, wherein the second conductive layers formed in the second region have the stepwise pattern, the method further comprising:

forming contact plugs coupled to the stepwise patterned second conductive layers, respectively, in the second region.

5. The method of claim 1, further comprising:

forming channel holes through the first conductive layers and the sacrificial layers in the first region;

forming second recess regions by etching the sacrificial layers exposed through the channel holes;

forming a charge storage layer in the second recess regions;

forming a tunnel insulating layer on inner walls of the channel holes; and forming a channel layer on the tunnel insulating layer.

6. The method of claim 5, further comprising:

forming a first charge blocking layer along inner surfaces of the second recess regions, before forming the charge storage layer.

7. The method of claim 1, further comprising:

forming a second charge blocking layer along inner surfaces of the first recess regions in which the sacrificial layers are etched before forming the second conductive layers.

8. The method of claim 1, further comprising:

forming memory cells stacked in the first region and corresponding to the second conductive layers, without forming memory cells in the second region.

9. The method claim 8, wherein one of the first conductive layers is interposed between every two adjacently stacked memory cells.

* * * * *